US012682955B2

(12) United States Patent
Qi et al.

(10) Patent No.: US 12,682,955 B2
(45) Date of Patent: Jul. 14, 2026

(54) MEMORY DEVICE AND OPERATION METHOD THEREOF, MEMORY SYSTEM, AND STORAGE MEDIUM

(71) Applicant: YANGTZE MEMORY TECHNOLOGIES CO., LTD., Wuhan (CN)

(72) Inventors: Wei Qi, Wuhan (CN); Da Li, Wuhan (CN); Ya Wang, Wuhan (CN); Feng Xu, Wuhan (CN); Yaoyao Tian, Wuhan (CN); Wenping Chen, Wuhan (CN); Shuai Zhang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 224 days.

(21) Appl. No.: 18/408,923

(22) Filed: Jan. 10, 2024

(65) Prior Publication Data

US 2025/0095739 A1 Mar. 20, 2025

(30) Foreign Application Priority Data

Sep. 14, 2023 (CN) .......................... 202311196820.8

(51) Int. Cl.
*G11C 16/08* (2006.01)
*G11C 16/04* (2006.01)
*G11C 16/26* (2006.01)

(52) U.S. Cl.
CPC .......... *G11C 16/08* (2013.01); *G11C 16/0433* (2013.01); *G11C 16/26* (2013.01)

(58) Field of Classification Search
CPC ..... G11C 16/08; G11C 16/0433; G11C 16/26; G11C 11/5642; G11C 16/0483; G11C 16/3427
See application file for complete search history.

(56) References Cited

U.S. PATENT DOCUMENTS

| | | | | |
|---|---|---|---|---|
| 10,049,758 | B2 * | 8/2018 | Costa | G11C 16/26 |
| 11,335,413 | B2 * | 5/2022 | Lien | G11C 16/0483 |
| 2010/0008136 | A1 * | 1/2010 | Seol | G11C 16/0483 |
| | | | | 365/185.18 |
| 2011/0222339 | A1 * | 9/2011 | Kim | G11C 16/3418 |
| | | | | 365/185.23 |
| 2012/0218850 | A1 * | 8/2012 | Youn | G11C 11/5642 |
| | | | | 365/226 |

(Continued)

*Primary Examiner* — Amir Zarabian
*Assistant Examiner* — Justin Bryce Heisterkamp
(74) *Attorney, Agent, or Firm* — Conley Rose, P.C.

(57) ABSTRACT

In some examples, a peripheral circuit is configured to: when performing a first read operation on memory cells coupled to a selected word line, apply a first pass voltage to a first word line, apply a second pass voltage to a second word line, and apply a third pass voltage to a third word line, wherein the first word line comprises at least one word line physically located above and below the selected word line respectively, both the second word line and the third word line comprise word lines physically located on a side of the first word line away from the selected word line, memory cells coupled to the second word line comprise programmed memory cells, memory cells coupled to the third word line comprise unprogrammed memory cells, and the first pass voltage, the second pass voltage and the third pass voltage are all different.

20 Claims, 14 Drawing Sheets

(56)     References Cited

U.S. PATENT DOCUMENTS

| | | | |
|---|---|---|---|
| 2015/0255166 A1* | 9/2015 | Tseng | G11C 16/0483 |
| | | | 365/185.17 |
| 2015/0325304 A1* | 11/2015 | Kim | G11C 16/10 |
| | | | 365/185.11 |
| 2016/0019971 A1* | 1/2016 | Horii | G11C 11/5642 |
| | | | 365/185.17 |
| 2016/0343414 A1* | 11/2016 | Lee | G11C 16/3427 |
| 2017/0092364 A1* | 3/2017 | Lee | G11C 16/10 |
| 2017/0221570 A1* | 8/2017 | Hong | G11C 16/26 |
| 2020/0013469 A1* | 1/2020 | Pachamuthu | G11C 16/0483 |
| 2020/0334148 A1* | 10/2020 | Lee | G06F 12/0804 |
| 2021/0035649 A1* | 2/2021 | Muchherla | G06F 3/0619 |
| 2022/0076761 A1* | 3/2022 | Lee | G11C 16/26 |
| 2023/0178160 A1* | 6/2023 | Liu | G11C 29/022 |
| | | | 365/185.09 |
| 2023/0410866 A1* | 12/2023 | Jin | G11C 11/1673 |
| 2024/0303187 A1* | 9/2024 | Shukla | G11C 11/5642 |
| 2024/0312536 A1* | 9/2024 | Han | G11C 16/26 |
| 2024/0420775 A1* | 12/2024 | Chen | G11C 11/5642 |
| 2025/0022517 A1* | 1/2025 | Lee | G11C 16/08 |

* cited by examiner

Figure 7:
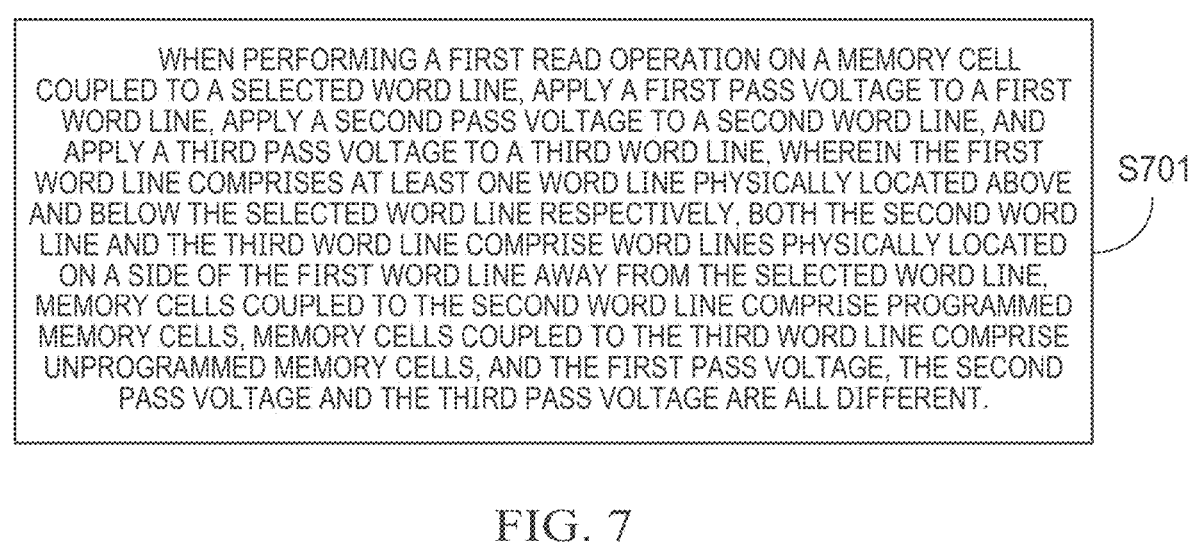

WHEN PERFORMING A FIRST READ OPERATION ON A MEMORY CELL COUPLED TO A SELECTED WORD LINE, APPLY A FIRST PASS VOLTAGE TO A FIRST WORD LINE, APPLY A SECOND PASS VOLTAGE TO A SECOND WORD LINE, AND APPLY A THIRD PASS VOLTAGE TO A THIRD WORD LINE, WHEREIN THE FIRST WORD LINE COMPRISES AT LEAST ONE WORD LINE PHYSICALLY LOCATED ABOVE AND BELOW THE SELECTED WORD LINE RESPECTIVELY, BOTH THE SECOND WORD LINE AND THE THIRD WORD LINE COMPRISE WORD LINES PHYSICALLY LOCATED ON A SIDE OF THE FIRST WORD LINE AWAY FROM THE SELECTED WORD LINE, MEMORY CELLS COUPLED TO THE SECOND WORD LINE COMPRISE PROGRAMMED MEMORY CELLS, MEMORY CELLS COUPLED TO THE THIRD WORD LINE COMPRISE UNPROGRAMMED MEMORY CELLS, AND THE FIRST PASS VOLTAGE, THE SECOND PASS VOLTAGE AND THE THIRD PASS VOLTAGE ARE ALL DIFFERENT.

MEMORY DEVICE AND OPERATION METHOD THEREOF, MEMORY SYSTEM, AND STORAGE MEDIUM

CROSS-REFERENCE TO RELATED APPLICATIONS

The present application claims priority to Chinese Patent Application No. 2023111968208, which was filed Sep. 14, 2023, is titled "MEMORY DEVICE AND OPERATING METHOD THEREOF, MEMORY SYSTEM, STORAGE MEDIUM," and is hereby incorporated herein by reference in its entirety.

TECHNICAL FIELD

The present disclosure relates to the field of semiconductor technologies, and in particular, to a memory device and an operation method thereof, a memory system, and a storage medium.

BACKGROUND

Non-volatile memory devices such as 3D NAND type memory with low power consumption, light weight and good performance have been widely used in electronic products. However, there are still many issues that are to be solved when performing a reading operation on a memory device in the related art.

SUMMARY

To address one or more of the existing technical problems, examples of the present disclosure provide a memory device and an operation method thereof, a memory system, and a storage medium. An example of the present disclosure provides a memory device, comprising a memory cell array and a peripheral circuit coupled to the memory cell array, wherein the memory cell array comprises a plurality of blocks, each of the blocks comprises a plurality of memory cells and a plurality of word lines coupled to the plurality of memory cells.

The peripheral circuit is configured to: when performing a first read operation on memory cells coupled to a selected word line, apply a first pass voltage to a first word line, apply a second pass voltage to a second word line, and apply a third pass voltage to a third word line, wherein the first word line comprises at least one word line physically located above and below the selected word line respectively, both the second word line and the third word line comprise word lines physically located on a side of the first word line away from the selected word line, memory cells coupled to the second word line comprise programmed memory cells, memory cells coupled to the third word line comprise unprogrammed memory cells, and the first pass voltage, the second pass voltage and the third pass voltage are all different.

In some examples, the first pass voltage is greater than the second pass voltage, and the second pass voltage is greater than the third pass voltage.

In some examples, the peripheral circuit is further configured to: perform memory state detection on a selected block, wherein a result of the memory state detection block comprises a close block and an open block; perform the first read operation on the memory cells coupled to the selected word line in the open block; and perform a second read operation on the memory cells coupled to the selected word line in the close block.

In some examples, the peripheral circuit is further configured to: when performing the second read operation on the memory cells coupled to the selected word line in the close block, apply the first pass voltage to a fourth word line, and apply the second pass voltage to a fifth word line, wherein the fourth word line comprises at least one word line physically located above and below the selected word line respectively, and the fifth word line comprises all word lines physically located on a side of the fourth word line away from the selected word line.

In some examples, the peripheral circuit is further configured to: after the first read operation is performed once, increment a read count by a first count value; and after the second read operation is performed once, increment the read count by a second count value, the first count value being less than the second count value.

In some examples, when the first word line and the third word line are the same word line, the first pass voltage is applied to the same word line.

In some examples, a dummy word line is provided between at least any two of the first word line, the second word line, and the third word line; and the peripheral circuit is further configured to: when performing the first read operation, apply the second pass voltage to the dummy word line.

In some examples, the peripheral circuit is further configured to: apply a read voltage to the selected word line during execution of the first read operation, wherein memory cells coupled to the selected word line comprise programmed memory cells.

In some examples, the memory device comprises a three-dimensional NAND type memory.

An example of the present disclosure also provides a memory system, comprising: one or more memory devices as described in the above examples of the present disclosure; and a memory controller coupled to the memory devices and configured to control the memory devices.

An example of the present disclosure also provides an operation method of a memory device. The operation method comprises: when performing a first read operation on memory cells coupled to a selected word line, applying a first pass voltage to a first word line, applying a second pass voltage to a second word line, and applying a third pass voltage to a third word line, wherein the first word line comprises at least one word line physically located above and below the selected word line respectively, both the second word line and the third word line comprise word lines physically located on a side of the first word line away from the selected word line, memory cells coupled to the second word line comprise programmed memory cells, memory cells coupled to the third word line comprise unprogrammed memory cells, and the first pass voltage, the second pass voltage and the third pass voltage are all different, and the memory device comprises: a memory cell array comprising a plurality of blocks, each of the blocks comprising a plurality of memory cells and a plurality of word lines coupled to the plurality of memory cells; and a peripheral circuit coupled to the memory cell array.

In some examples, the first pass voltage is greater than the second pass voltage, and the second pass voltage is greater than the third pass voltage.

In some examples, the operation method further comprises: performing memory state detection on a selected block, wherein a result of the memory state detection comprises a close block and an open block; performing the first read operation on the memory cells coupled to the selected word line in the open block; and performing a second read operation on the memory cells coupled to the selected word line in the close block.

In some examples, the operation method further comprises: when performing the second read operation on the memory cells coupled to the selected word line in the close block, applying the first pass voltage to a fourth word line, and applying the second pass voltage to a fifth word line, wherein the fourth word line comprises at least one word line physically located above and below the selected word line respectively, and the fifth word line comprises all word lines physically located on a side of the fourth word line away from the selected word line.

In some examples, the operation method further comprises: after the first read operation is performed once, incrementing a read count by a first count value; and after the second read operation is performed once, incrementing the read count by a second count value, the first count value being less than the second count value.

In some examples, when the first word line and the third word line are the same word line, the first pass voltage is applied to the same word line.

In some examples, a dummy word line is provided between at least any two of the first word line, the second word line, and the third word line; and the operation method further comprises: when performing the first read operation, applying the second pass voltage to the dummy word line.

In some examples, the operation method further comprises: applying a read voltage to the selected word line during execution of the first read operation, wherein memory cells coupled to the selected word line comprise programmed memory cells.

An example of the present disclosure also provides a storage medium storing thereon executable instructions that, when executed by a memory controller, can implement operations of the method described in the above examples of the present disclosure.

Examples of the present disclosure provide a memory device and an operation method thereof, a memory system, and a storage medium. The memory device comprises a memory cell array and a peripheral circuit coupled to the memory cell array, wherein the memory cell array comprises a plurality of blocks, each of the blocks comprises a plurality of memory cells and a plurality of word lines coupled to the plurality of memory cells. The peripheral circuit is configured to: when performing a first read operation on memory cells coupled to a selected word line, apply a first pass voltage to a first word line, apply a second pass voltage to a second word line, and apply a third pass voltage to a third word line, wherein the first word line comprises at least one word line physically located above and below the selected word line respectively, both the second word line and the third word line comprise word lines physically located on a side of the first word line away from the selected word line, memory cells coupled to the second word line comprise programmed memory cells, memory cells coupled to the third word line comprise unprogrammed memory cells, and the first pass voltage, the second pass voltage and the third pass voltage are all different. In the examples of the present disclosure, when performing the first read operation, a first pass voltage is applied to a first word line adjacent to a selected word line to reduce the coupling effect of the read voltage on the adjacent word lines. Meanwhile, a third pass voltage is applied to a third word line coupled to unprogrammed memory cells to reduce the read interference caused by the first read operation to the unprogrammed memory cells and improve the read performance and reliability of the memory device.

BRIEF DESCRIPTION OF THE DRAWINGS

FIG. 7 is a schematic flowchart of a method for performing a first read operation on an open block according to an example of the present disclosure.

Figure 1:
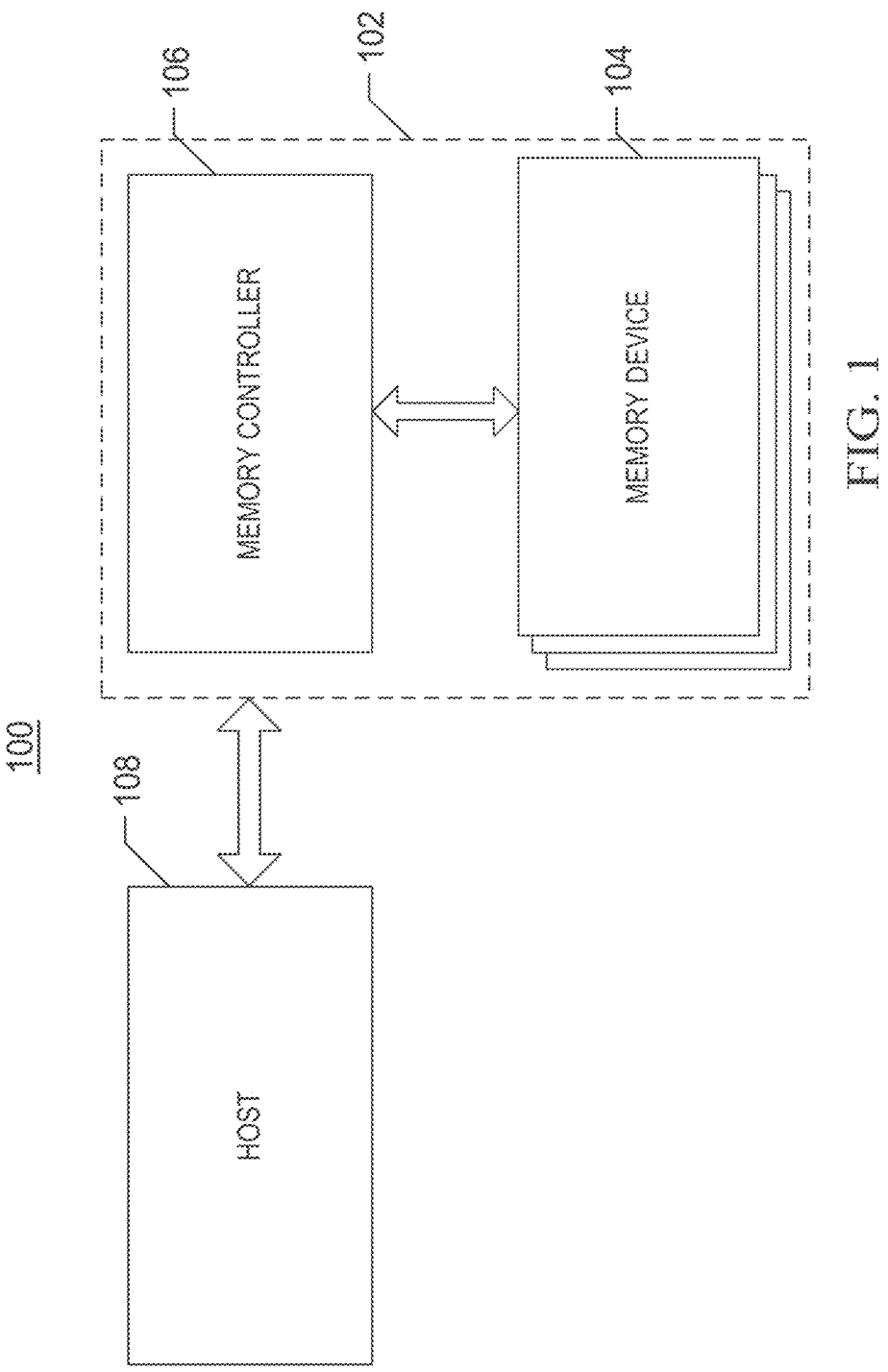
FIG. 1 is a schematic diagram of an example system with a memory system according to an example of the present disclosure.

In the above drawings (which are not drawn to scale), like reference numerals may describe like parts in the different views. Like reference numbers with different letter suffixes may indicate different examples of like parts. The drawings illustrate the various examples discussed herein, by way of example and not limitation.

DETAILED DESCRIPTION

Examples of the present disclosure will be described in more detail below with reference to the accompanying drawings. Although examples of the present disclosure are shown in the drawings, it should be understood that the present disclosure may be implemented in various ways and should not be limited to the detailed description set forth herein. Rather, these examples are provided so that the present disclosure can be more thoroughly understood and the scope of the present disclosure can be conveyed to those skilled in the art.

In the following description, numerous details are given in order to provide a more thorough understanding of the present disclosure. It will be apparent, however, to one skilled in the art that the present disclosure may be practiced without one or more of these details. In other examples, some technical features well-known in the art are not described to avoid confusion with the present disclosure; that is, not all features of the actual example are described here, and well-known functions and structures are not described in detail.

In the drawings, the size of layers, regions, elements and their relative sizes may be exaggerated for clarity. Like reference numerals refer to like elements throughout.

It will be understood that when an element or layer is referred to as being "on," "adjacent to," "connected to" or "coupled to" another element or layer, it can be directly on, adjacent to, connected to, or coupled to other elements or layers, or intervening elements or layers may be present. In contrast, when an element is referred to as being "directly on," "directly adjacent to," "directly connected to" or "directly coupled to" another element or layer, there are no intervening elements or layers. It will be understood that, although the terms such as first, second, third etc. may be used to describe at least one of various elements, components, regions, layers or sections, at least one of these elements, components, regions, layers or sections should not be limited by these terms. These terms are only used to distinguish one element, component, region, layer or section from another element, component, region, layer or section. Thus, a first element, component, region, layer or section discussed below could be represented as a second element, component, region, layer or section without departing from the teachings of the present disclosure. When a second element, component, region, layer or section is discussed, it does not indicate that a first element, component, region, layer or section exists in the present disclosure.

Spatial relationship terms such as "under", "below", "beneath", "underneath", "on", "above" and so on, can be used here for convenience to describe the relationship between one element or feature and other elements or features shown in the figures. It will be understood that the spatial relationship terms also comprise different orientations of the device in use and operation in addition to the orientation depicted in the figures. For example, if the device in the figures is turned over, elements or features described as "below" or "underneath" or "under" other elements or features would then be oriented as "above" the other elements or features. Thus, the example terms "below" and "under" can comprise both orientations of above and below. The device may be otherwise oriented (rotated 90 degrees or at other orientations) and the spatial descriptors used herein may be interpreted accordingly.

The terminology used herein is for the purpose of describing particular examples only and is not to be taken as a limitation of the present disclosure. As used herein, "a", "an" and "said/the" in singular forms are intended to include the plural forms as well, unless the context clearly dictates otherwise. It should also be understood that at least one of the terms "consists of" or "comprising", when used in this disclosure, identify the presence of at least one of stated features, integers, operations, elements or components, but do not exclude presence or addition of at least one of one or more other features, integers, operations, elements, components or groups. As used herein, the term "at least one of . . . " includes any and all combinations of the associated listed items.

For ease of understanding the characteristics and technical content of the examples of the present disclosure in more detail, the example of the examples of the present disclosure will be described in detail below in conjunction with the accompanying drawings. The attached drawings are only for reference and description, and are not intended to limit the examples of the present disclosure.

The memory device in the examples of the present disclosure includes but is not limited to a three-dimensional NAND type memory, and for ease of understanding, a three-dimensional NAND type memory is used as an example for illustration.

FIG. 1 illustrates a block diagram of an example system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive data to or from the memory device 104.

Memory controller 106 is coupled to the memory device 104 and host 108 and is configured to control the memory device 104, according to some examples. Memory controller 106 can manage the data stored in memory device 104 and communicate with host 108. In some examples, memory controller 106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some examples, memory controller 106 is designed for operating in a high duty-cycle environment solid state disks (SSD) or embedded multi-media-cards (eMMCs) used as data storage for mobile devices, such as smartphones, tablets, laptop computers, etc., and enterprise storage arrays.

Memory controller 106 can be configured to control operations of the memory device 104, such as read, erase, and program operations. Memory controller 106 can also be configured to manage various functions with respect to the data stored or to be stored in the memory device 104 including, but not limited to bad-block management, garbage collection, logical-to-physical address conversion, wear leveling, etc. In some examples, memory controller 106 is further configured to process error correction codes (ECCs) with respect to the data read from or written to the memory device 104. Any other suitable functions may be performed by memory controller 106 as well, for example, formatting the memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI)

protocol, an enhanced small disk interface (ESDI) protocol, an integrated drive electronics (IDE) protocol, a Firewire protocol, etc.

Figure 2B:
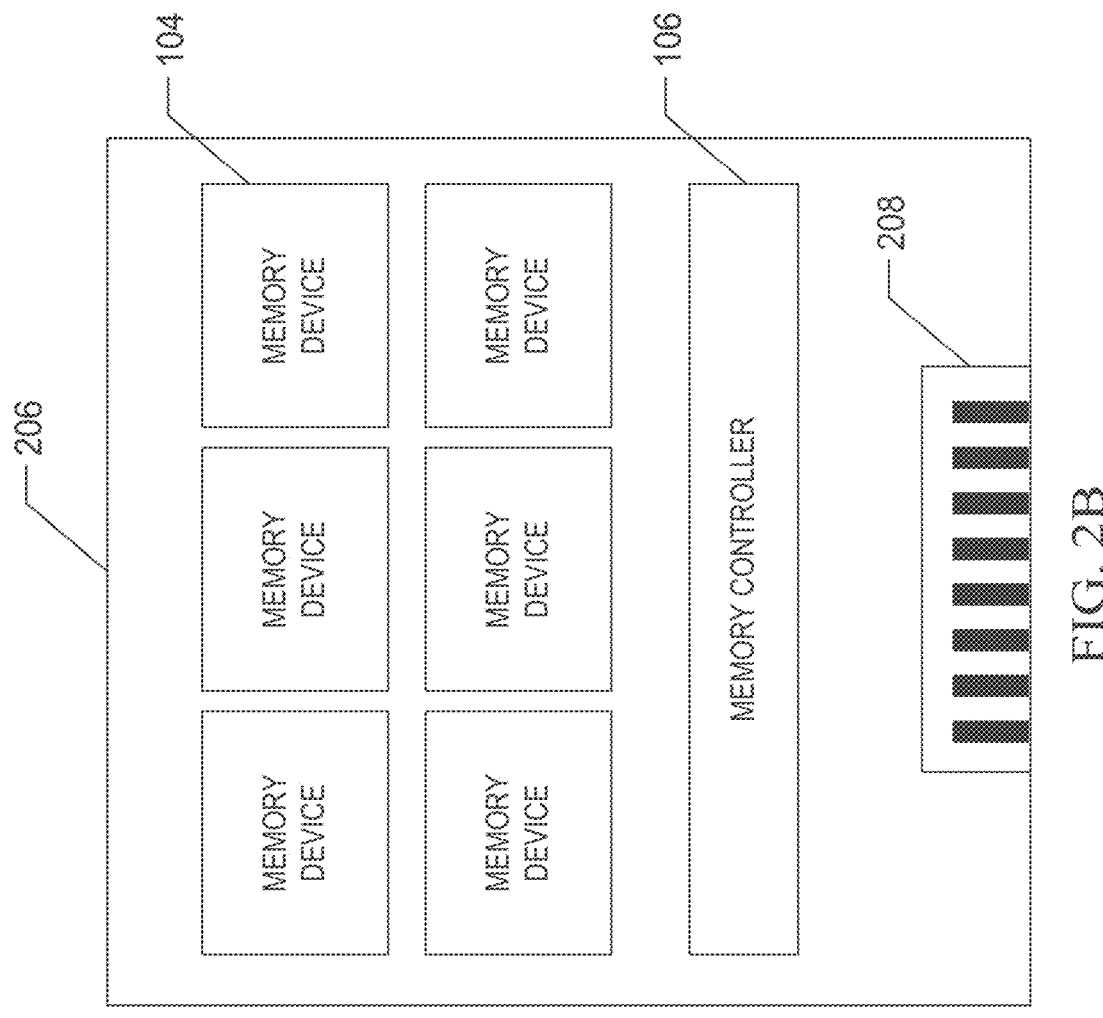
FIG. 2B is a schematic diagram of an example solid state drive with a memory system according to an example of the present disclosure.
Figure 2A:
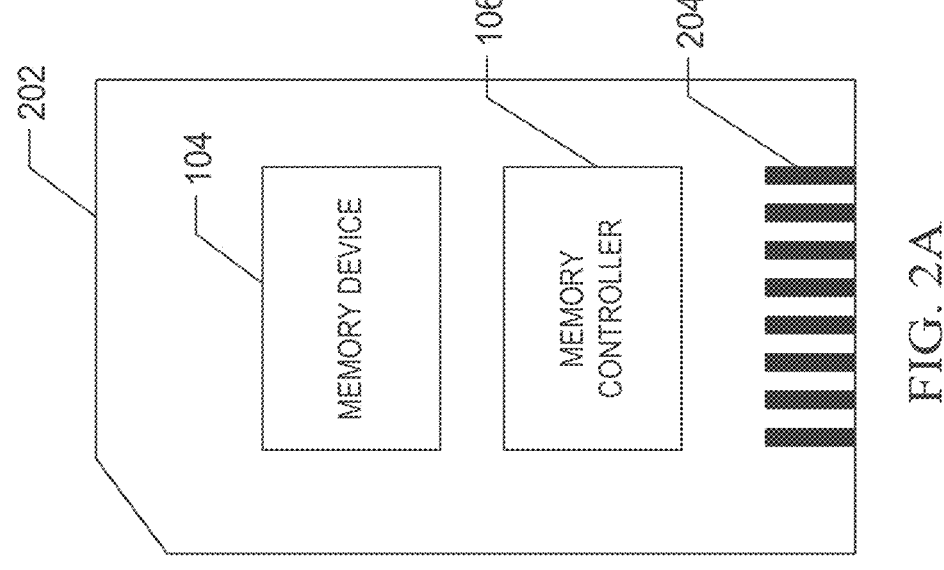
FIG. 2A is a schematic diagram of an example memory card with a memory system according to an example of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2a, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling the memory card 202 with a host (e.g., host 108 in FIG. 1). In another example as shown in FIG. 2b, the memory controller 106 and multiple memory devices 104 may be integrated into an SSD 206. SSD 206 can further include an SSD connector 208 coupling SSD 206 with a host (e.g., host 108 in FIG. 1). In some examples, at least one of the storage capacity or the operation speed of SSD 206 is greater than those of memory card 202.

Figure 3A:
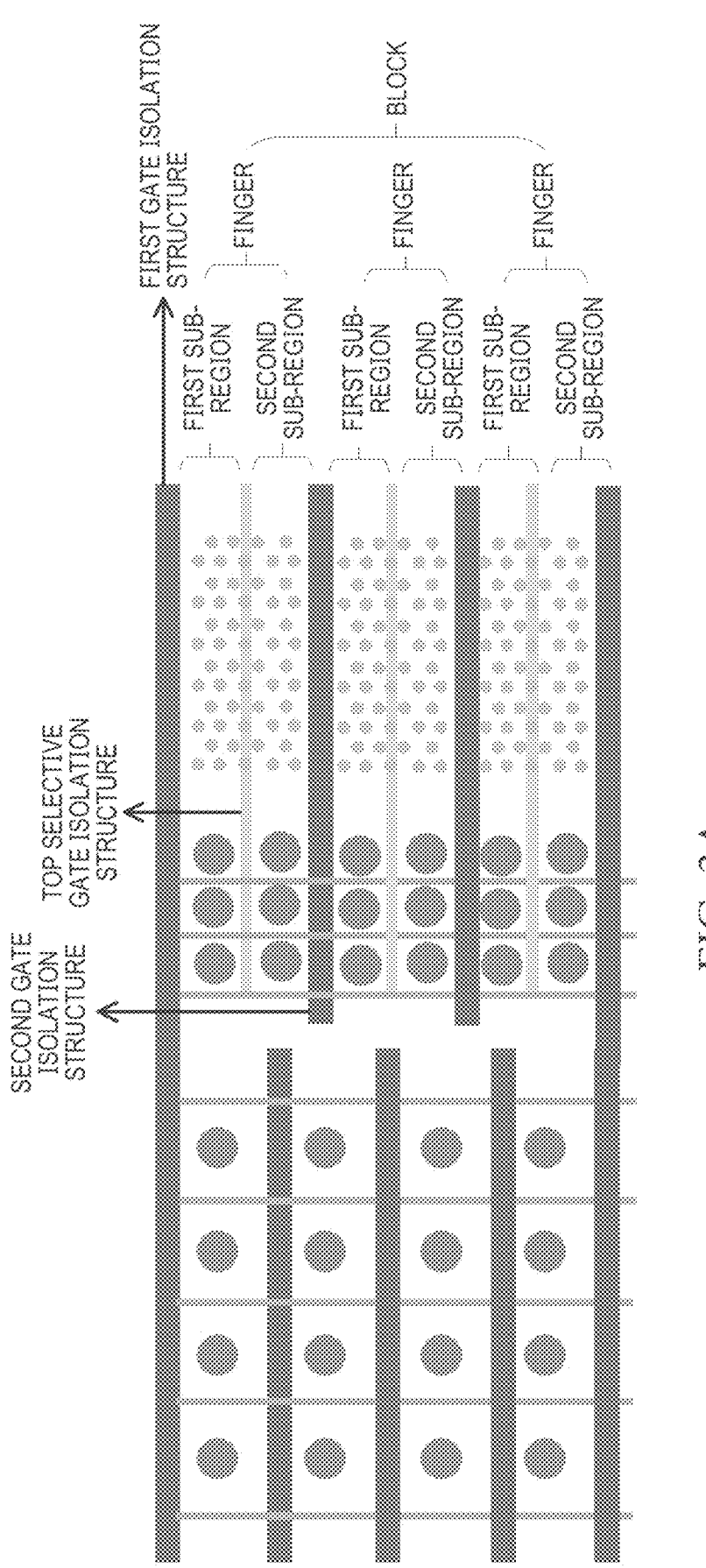
FIG. 3A is a schematic diagram of the distribution of memory cells of a three-dimensional NAND type memory according to an example of the present disclosure.

FIG. 3A provides a structural schematic diagram of a memory cell array of a three-dimensional NAND type memory. As shown in FIG. 3A, the memory cell array of a three-dimensional NAND type memory consists of several memory cell rows parallel to gate isolation structure and staggered in parallel. Every two rows of the memory cell rows are separated by a gate isolation structure and a top selective gate isolation structure, and each memory cell row includes a plurality of memory cells. The gate isolation structure may include a first gate isolation structure and a second gate isolation structure. The first gate isolation structure divides the memory cell array into a plurality of blocks, the plurality of second gate isolation structures can divide the blocks into multiple fingers, and the top selective gate isolation structure provided in the middle of each finger can divide the finger into two parts, so that the finger is divided into two memory strings. A block shown in FIG. 3A contains 6 memory strings, and in practical applications, the number of memory strings in a block is not limited to this.

In some examples, each block can be coupled to multiple word lines, and multiple memory cells coupled to each individually controlled word line form a page. By way of example, all the memory cells in each memory string in FIG. 3A are coupled to form a page.

It should be noted that the number of memory cell rows between the gate isolation structure and the top selective gate isolation structure shown in FIG. 3A is merely an example, and is not used for limiting the number of memory cell rows contained in one finger of the three-dimensional NAND type memory in the present disclosure. In practical applications, the number of memory cell rows contained in one finger can be adjusted according to actual conditions, such as 2, 4, 8, 16, and so on.

Figure 3B:
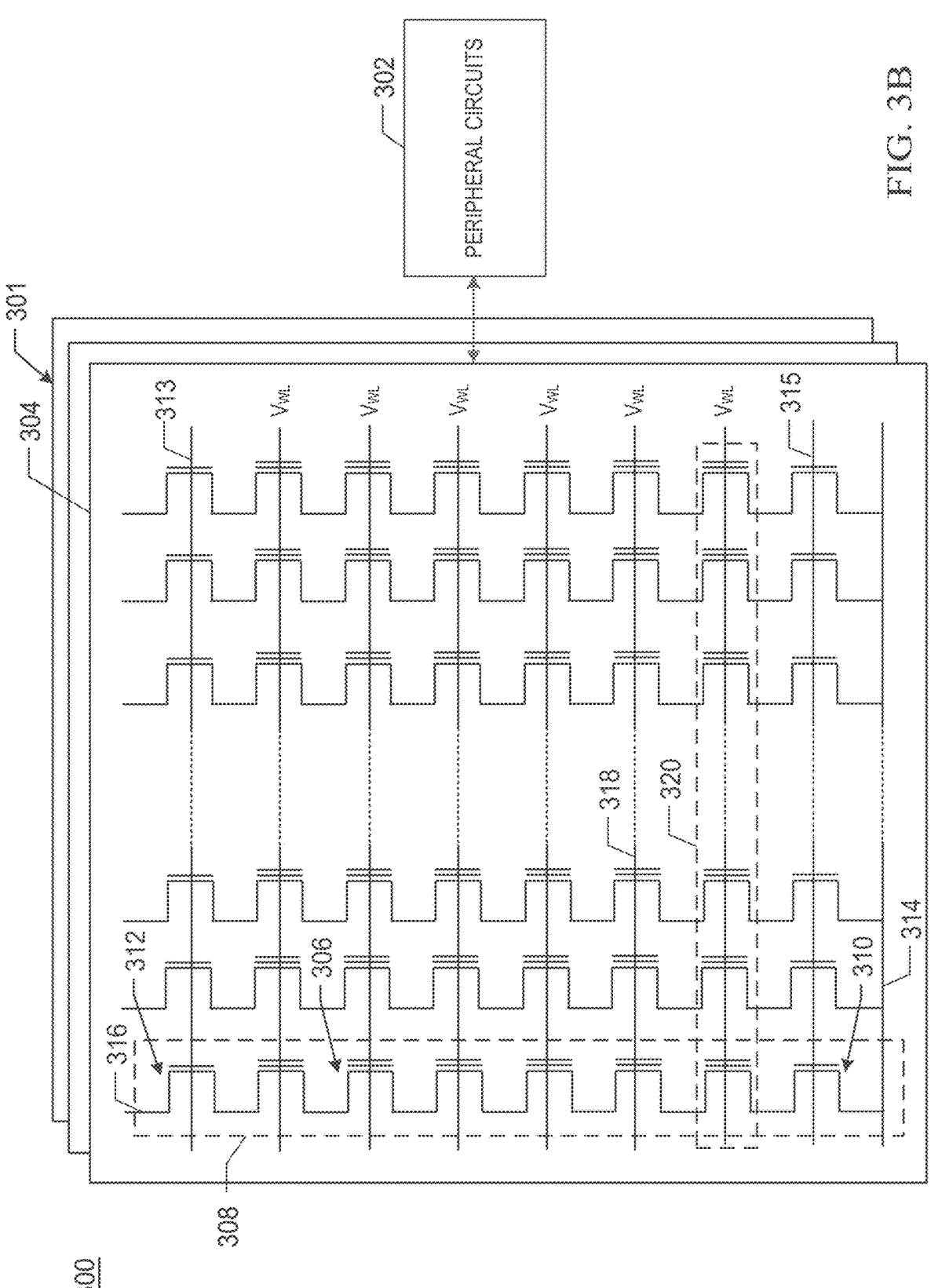
FIG. 3B is a schematic diagram of an example memory including peripheral circuits according to an example of the present disclosure.

FIG. 3B illustrates a schematic circuit diagram of an example memory device 300 including peripheral circuits, according to some aspects of the present disclosure. The memory device 300 can be an example of the memory device 104 in FIG. 1. The memory device 300 can include a memory cell array 301 and peripheral circuits 302 coupled to memory cell array 301. The memory cell array 301 is illustrated as an example of a three-dimensional NAND type memory cell array, in which memory cells 306 are NAND type memory cells and are provided in the form of an array of memory strings 308 each extending vertically above a substrate (not shown). In some examples, each memory string 308 includes a plurality of memory cells 306 coupled in series and stacked vertically. Each memory cell 306 can hold a continuous, analog value, such as an electrical voltage or charge, that depends on the number of electrons trapped within a region of the memory cell 306. Each memory cell 306 can be either a floating gate type of memory cell including a floating-gate transistor or a charge trap type of memory cell including a charge-trap transistor.

In some examples, each memory cell 306 is a single-level cell (SLC) that has two possible memory states and thus, can store one bit of data. For example, the first memory state "0" can correspond to a first range of voltages, and the second memory state "1" can correspond to a second range of voltages. In some examples, each memory cell 306 is a multi-level cell (MLC) that is capable of storing more than a single bit of data in more than four memory states. For example, the MLC can store two bits per cell (also known as Double-Level Cell), three bits per cell (also known as Trinary-Level cell (TLC)), four bits per cell (also known as a Quad-Level cell (QLC)), five bits per cell (also known as a Penta-Level cell (PLC)) or more than five bits per cell. Each MLC can be programmed to assume a range of possible nominal storage values. In one example, if each MLC stores two bits of data, then the MLC can be programmed to assume one of three possible programming levels from an erased state by writing one of three possible nominal storage values to the cell. A fourth nominal storage value can be used for the erased state.

As shown in FIG. 3B, each memory string 308 can include a bottom selective transistor 310 (also referred to as a source selective transistor BSG, which includes a source selective gate) at its source end and a top selective transistor 312 (also known as a drain selective transistor TSG, which includes a drain selective gate) at its drain end. Source selective transistor BSG 310 and drain selective transistor TSG 312 can be configured to activate selected memory strings 308 during read and program operations. In some examples, the sources of memory strings 308 in the same block 304 are coupled through the same source line (SL) 314, e.g., a common SL. In other words, all memory strings 308 in the same block 304 have an array common source (ACS), according to some examples. TSG 312 of each memory string 308 is coupled to a respective bit line (BL) 316 from which data can be read or written via an output bus (not shown), according to some examples. In some examples, each memory string 308 is configured to be selected or deselected by at least one of: applying a select voltage (e.g., above the threshold voltage of the transistor having TSG 312) or a deselect voltage (e.g., 0 V) to respective TSG 312 through one or more TSG lines 313 or applying a select voltage (e.g., above the threshold voltage of the transistor having BSG 310) or a deselect voltage (e.g., 0 V) to respective BSG 310 through one or more BSG lines 315.

As shown in FIG. 3B, NAND memory strings 308 can be organized into multiple blocks 304, each of which can have a common source line 314, e.g., coupled to the ground. In some examples, each block 304 is the basic data unit for erase operations, e.g., all memory cells 306 on the same block 304 are erased at the same time. To erase memory cells 306 in a selected block 304, source lines 314 coupled to selected block 304 as well as unselected blocks 304 in the same plane as selected block 304 can be biased with an erase voltage (Vers), such as a high positive voltage (e.g., 20 V or more). It is understood that in some examples, erase operation may be performed at a half-block level, a quarter-block level, or a level having any suitable number of blocks or any suitable fractions of a block. Memory cells 306 of adjacent memory strings 308 can be coupled through word lines 318 that select which row of memory cells 306 is affected by read and program operations. In some examples, with reference to FIG. 3A above, the plurality of memory cells are isolated by the top selective gate isolation structure and the gate isolation structure. The multiple memory cells between the top selective gate isolation structure and the gate isolation structure are arranged into multiple memory cell rows, and each memory cell row is parallel to the gate isolation structure and the top selective gate isolation structure. Memory cells in strings that share the same word line form a physical page 320, and each physical page 320 can be mapped to at least one logical page based on the storage mode (for example SLC or MLC as mentioned above) of the corresponding memory cell 306. A logical page can constitute the basic data unit for program operations and read operations.

Referring to FIG. 3A and FIG. 3B, each memory cell 306 of the plurality of memory cells is coupled to respective word lines 318, and each memory string 308 is coupled to respective bit lines 316 via a respective selective transistor (such as top selective transistor (TSG) 312).

Figure 4:
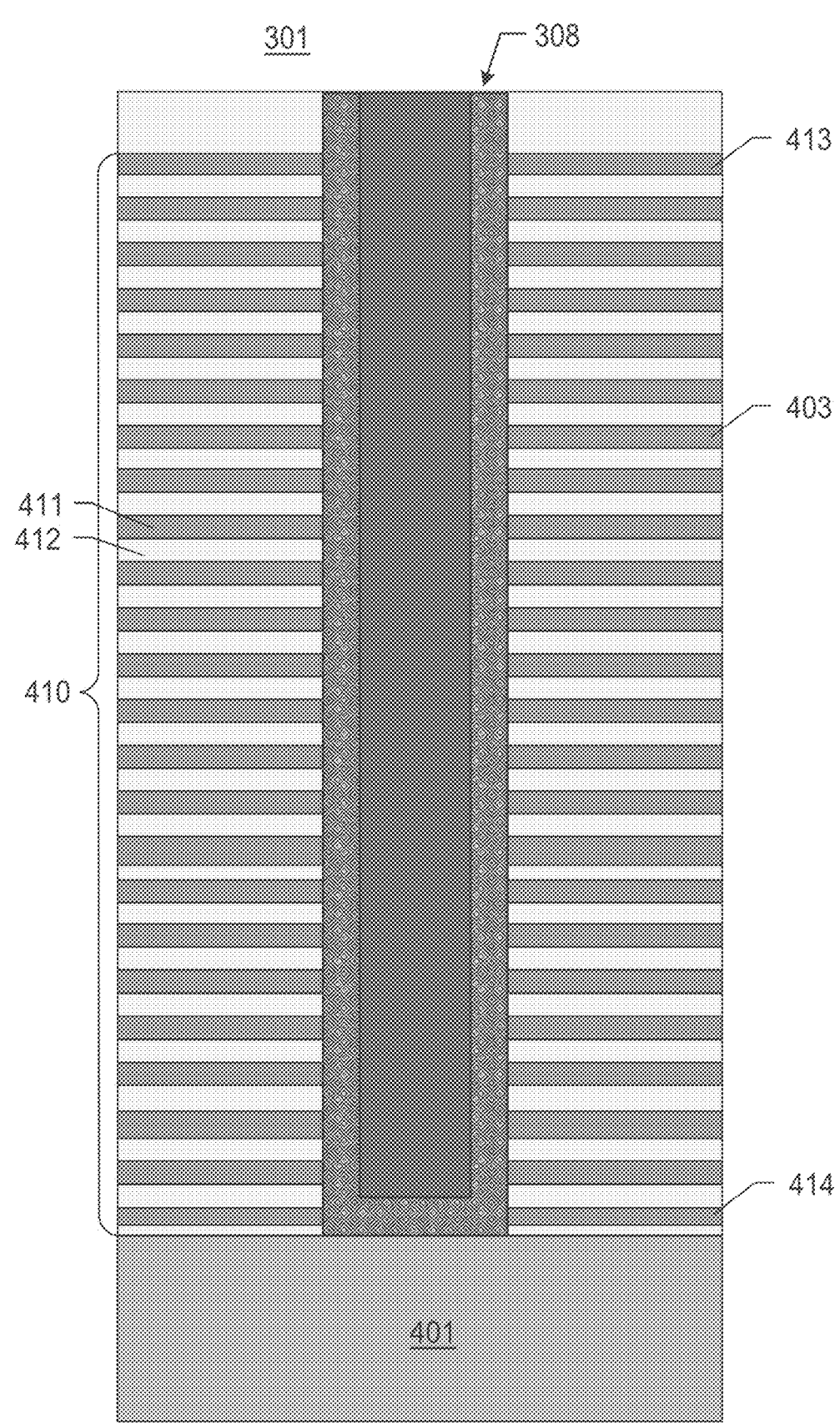
FIG. 4 is a schematic cross-sectional view of a memory cell array including NAND type memory strings according to an example of the present disclosure.

FIG. 4 shows a schematic cross-sectional view of an example memory cell array 301 including memory strings 308, exemplified by NAND, in accordance with aspects of the present disclosure. As shown in FIG. 4, the NAND memory cell array 301 may include a stacked structure 410, which includes a plurality of gate layers 411 and a plurality of insulating layers 412 alternately stacked in sequence, and a channel structure penetrating vertically through the gate layers 411 and the insulating layers 412. The channel structure is coupled with each gate layer to form a memory cell, and the channel structure is coupled with multiple gate layers in the stacked structure 410 to form a memory string 308. The gate layer 411 and the insulating layer 412 can be stacked alternately, and two adjacent gate layers 411 are separated by an insulating layer 412.

The constituent material of the gate layer 411 may include a conductive material. The conductive material may include but is not limited to tungsten (W), cobalt (Co), Copper (Cu), aluminum (Al), polysilicon, doped silicon, silicide, or any combination thereof. In some examples, each gate layer 411 may include a metal layer, e.g., a tungsten layer. In some examples, each gate layer 411 includes a doped polysilicon layer. Each gate layer 411 may include a control gate surrounding the memory cell. The gate layer 411 at the top of the stacked structure 410 may extend laterally as a top selective gate line, the gate layer 411 at the bottom of the stacked structure 410 may extend laterally as a bottom selective gate line, and the gate layer 411 extending laterally between the top selective gate line and the bottom selective gate line may be used as a word line layer.

In some examples, the stacked structure 410 may be disposed on a substrate 401. The substrate 401 may include silicon (e.g., monocrystalline silicon), silicon germanium (SiGe), gallium arsenide (GaAs), germanium (Ge), silicon-on-insulator (SOI), germanium-on-insulator (GOI), or any other suitable material.

In some examples, memory string 308 includes a channel structure extending vertically through the stacked structure 410. In some examples, the channel structure includes a channel hole filled with semiconductor material(s) (e.g., as a semiconductor channel) and dielectric material(s) (e.g., as a memory film). In some examples, the semiconductor channel includes silicon, e.g., polysilicon. In some examples, the memory film is a composite dielectric layer including a tunneling layer, a storage layer (also referred to as a "charge trap/storage layer"), and a blocking layer. The channel structure may have a cylindrical shape (e.g., a pillar shape). According to some examples, the semiconductor channel, the tunneling layer, the storage layer and the blocking layer are radially arranged in this order from the center of the pillar toward the outer surface of the pillar. The tunneling layer may include silicon oxide, silicon oxynitride, or any combination thereof. The storage layer may include silicon nitride, silicon oxynitride, or any combination thereof. The blocking layer may include silicon oxide, silicon oxynitride, a high dielectric constant (high-k) dielectric, or any combination thereof. In one example, the memory film may include a composite layer of silicon oxide/silicon oxynitride/silicon oxide (ONO).

Figure 5:
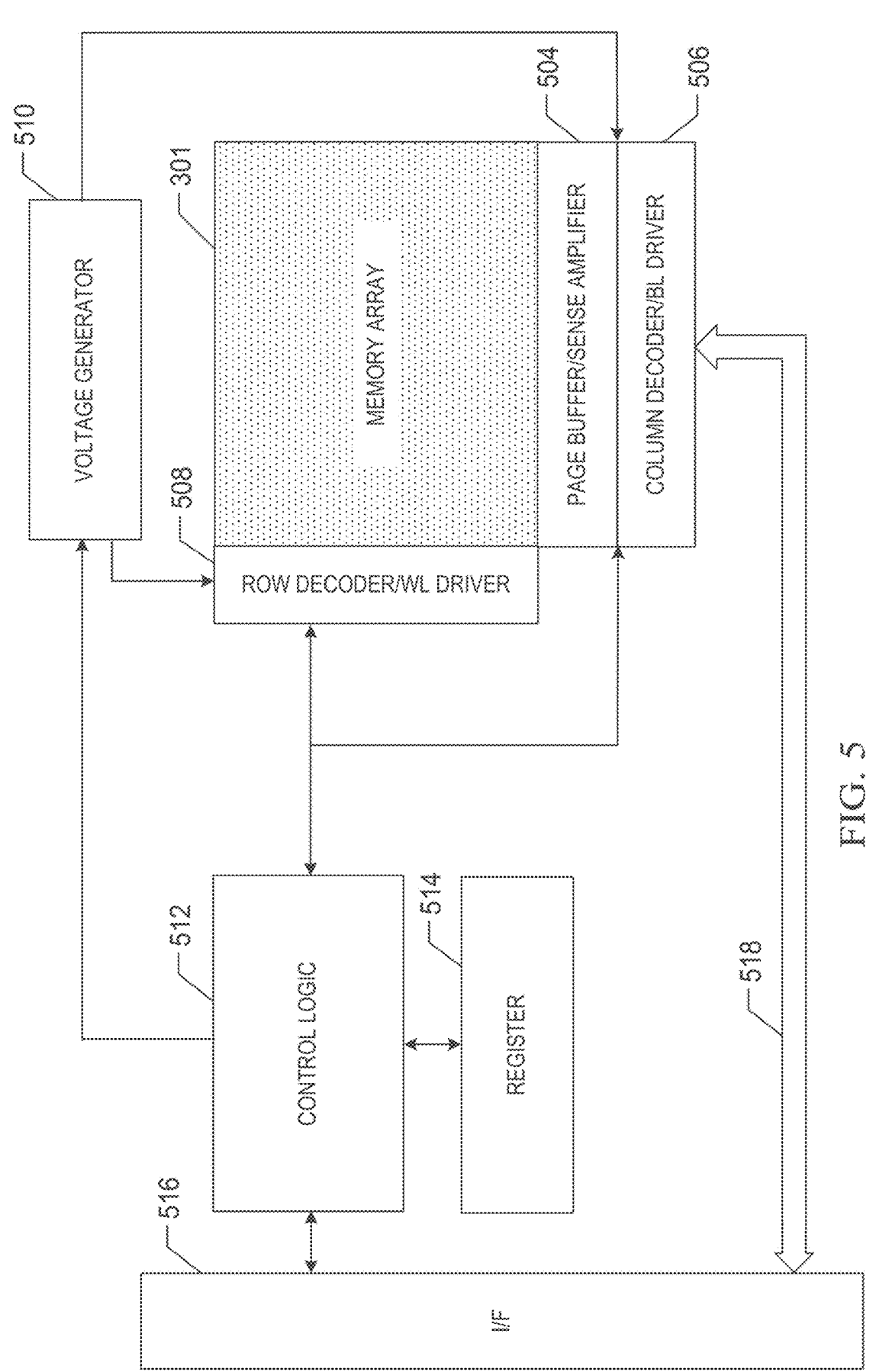
FIG. 5 is a schematic diagram of an example memory device including a memory cell array and peripheral circuits according to an example of the present disclosure.

Referring back to FIG. 3B, peripheral circuits 302 can be coupled to memory cell array 301 through bit lines 316, word lines 318, source lines 314, BSG lines 315, and TSG lines 313. Peripheral circuits 302 can include any suitable analog, digital, and mixed-signal circuits for facilitating the operations of memory cell array 301 by applying and sensing at least one of voltage signals or current signals to and from each target memory cell 306 through bit lines 316, word lines 318, source lines 314, BSG lines 315, and TSG lines 313. Peripheral circuits 302 can include various types of peripheral circuits formed using metal-oxide-semiconductor (MOS) technologies. For example, FIG. 5 illustrates some example peripheral circuits, the peripheral circuits 302 including a page buffer/sense amplifier 504, a column decoder/bit line driver 506, a row decoder/word line driver 508, a voltage generator 510, control logic 512, registers 514, an interface 516, and a data bus 518. It is understood that in some examples, additional peripheral circuits not shown in FIG. 5 may be included as well.

Page buffer/sense amplifier 504 can be configured to read and program (write) data from and to memory cell array 301 according to the control signals from control logic 512. In one example, page buffer/sense amplifier 504 may store program data (write data) to be programmed into memory cell array 301. In another example, page buffer/sense amplifier 504 may perform program verify operations to ensure that the data has been properly programmed into memory cells 306 coupled to selected word lines 318. In still another example, page buffer/sense amplifier 504 may also sense the low power signals from bit line 316 that represents a data bit stored in memory cell 306 and amplify the small voltage swing to recognizable logic levels in a read operation. Column decoder/bit line driver 506 can be configured to be controlled by control logic 512 and select one or more memory strings 308 by applying bit line voltages generated from voltage generator 510.

Row decoder/word line driver 508 can be configured to be controlled by control logic 512 and select/deselect blocks 304 of memory cell array 301 and select/deselect word lines 318 of block 304. Row decoder/word line driver 508 can be further configured to drive word lines 318 using word line voltages generated from voltage generator 510. In some examples, row decoder/word line driver 508 can also select/ deselect and drive BSG lines 315 and TSG lines 313 as well. As described below in detail, row decoder/word line driver 508 is configured to perform program operations on the memory cells 306 coupled to the selected word line(s) 318. Voltage generator 510 can be configured to be controlled by control logic 512 and generate the word line voltages (e.g., read voltage, program voltage, pass voltage, channel boost voltage, verification voltage, etc.), bit line voltages, and source line voltages to be supplied to memory cell array 301.

Control logic 512 may be coupled to each other part of the peripheral circuits described above and configured to control the operation of each other part of the peripheral circuits. Registers 514 can be coupled to control logic 512 and include status registers, command registers, and address registers for storing status information, command operation codes (OP codes), and command addresses for controlling the operations of each peripheral circuit. Interface 516 may be coupled to control logic 512 and act as a control buffer to buffer and relay control commands received from a host (not shown) to control logic 512, and to buffer and relay status information received from control logic 512 to the host. Interface 516 may further be coupled to column decoder/bit line driver 506 via data bus 518 and act as a data I/O interface and data buffer to buffer and relay data to or from memory cell array 301.

In practical applications, a 3D NAND type memory may include at least one memory cell array. The memory cell array may include multiple memory cell layers stacked in a vertical direction, and each memory cell layer may include multiple memory cells. Multiple memory cells in each memory cell layer may be coupled to a word line. Multiple memory cell layers can be divided into multiple blocks. With the development of the 3D NAND type memory, the number of memory cell layers is increasing, and the size of a single block is also getting larger, resulting in the situation where the block is not fully written (open block). However, when a read operation is performed on an open block, a variety of problems may occur that affect read performance. For example, with the increase in the number of stacked layers and the miniaturization of device sizes, the distance between memory cell layers becomes smaller and smaller. When a read voltage is applied to a selected word line, coupling effect between the selected word line and adjacent word lines is likely to occur. The closer the distance between the selected word line and adjacent word lines, the more severe the coupling effect. For example, when a read voltage is applied to the selected word line, read interference will be induced on the unselected word lines, especially on the unprogrammed memory cells coupled to the unselected word lines, thus affecting the subsequent use of the unprogrammed memory cells.

In view of one or more of the above problems, examples of the present disclosure provide a memory device and an operation method thereof, wherein the memory device includes a peripheral circuit and a memory cell array coupled to the peripheral circuit.

Peripheral circuit may include at least one of any suitable digital, analog, or mixed-signal circuit configured to facilitate the memory to implement various operations such as read operations, write operations, erase operations, and the like. For example, the peripheral circuit may include control logic (such as a control circuit or controller), a data buffer, a decoder (a decoder may also be called a coder), a driver, and a read and write circuit, etc. When the control logic receives the command and address data for read and write operations, the decoder can apply the corresponding voltage derived from the driver to the corresponding bit line and word line based on the decoded address under the action of the control logic to realize the data reading and writing, and exchange data with external devices through the data buffer.

The memory cell array may include multiple blocks, and each of the blocks may include multiple memory strings. Each memory string may include multiple memory cells stacked in a vertical direction. The topmost memory cell (top selective transistor TSG) of each memory string is coupled to the top selective line SSL, the bottommost memory cell of each memory string (bottom selective transistor BSG) is coupled to the ground selective line GSL, and the multiple memory cells located between the topmost memory cell and the bottommost memory cell are coupled to multiple word lines (WL). Here, the multiple word lines may include a dummy word line (DWL), a select word line (namely Sel. WL), an unselect word line (namely Unsel.WL), etc.

It should be noted that the programming sequence for the programming process of the 3D NAND type memory is to start programming from the memory cell closest to the bottom selective transistor BSG in the memory string, and end programming at the memory cell closest to the top selective transistor TSG from bottom to top. This programming sequence can be called a Normal Program Sequence or Forward Program Sequence. In other examples, the programming sequence is to start programming from the memory cell closest to the top selective transistor TSG, and end programming at the memory cell closest to the bottom selective transistor BSG from top to bottom. This programming sequence may be called a reverse sequence programming. In some examples, the memory states of the blocks in the memory cell array is different due to the different amounts of data to be programmed. For example, some blocks in the memory cell array may be close blocks and some blocks are open blocks. As an example, FIG. 6A shows a schematic diagram of a memory string in a close block, and FIG. 6B and FIG. 6C both show a schematic diagram of a memory string in an open block (where the programming sequence of the memory string shown in FIG. 6B is the reverse sequence programming, and the programming sequence of the memory string shown in FIG. 6C is the Normal Program Sequence, which will be explained in detail below and will not be repeated here).

The block can be read after it has been programmed.

It should be noted that based on the different memory states of the above block (close or open), the problems that may occur during the reading process are also different. In consideration of this, before performing a read operation on the block, the operation method of the memory device includes: performing memory state detection on a selected block, wherein a result of the memory state detection comprises a close block and an open block; performing the first read operation on the memory cells coupled to the selected word line in the open block; and performing a second read operation on the memory cells coupled to the selected word line in the close block.

Figure 6A:
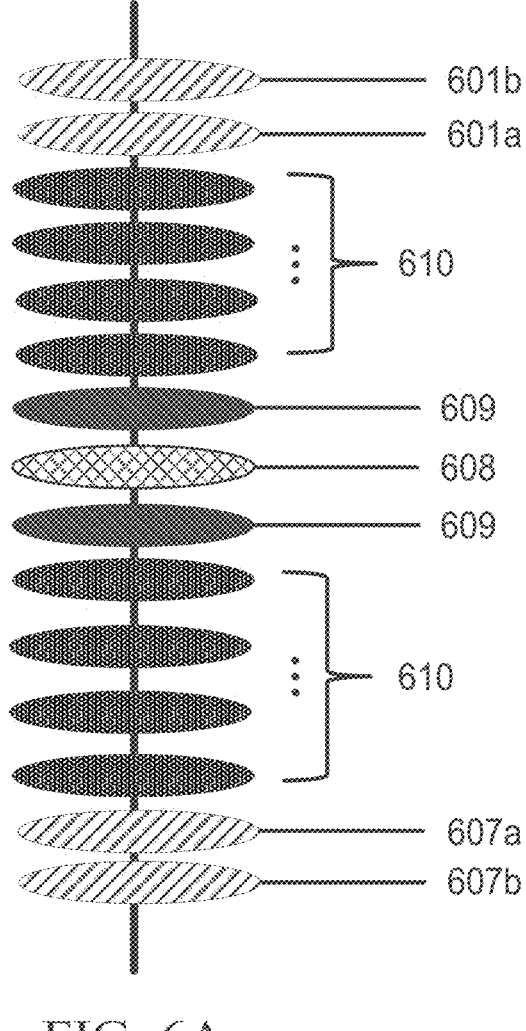
FIG. 6A is a schematic diagram of a memory string in a close block according to an example of the present disclosure.
Figure 6B:
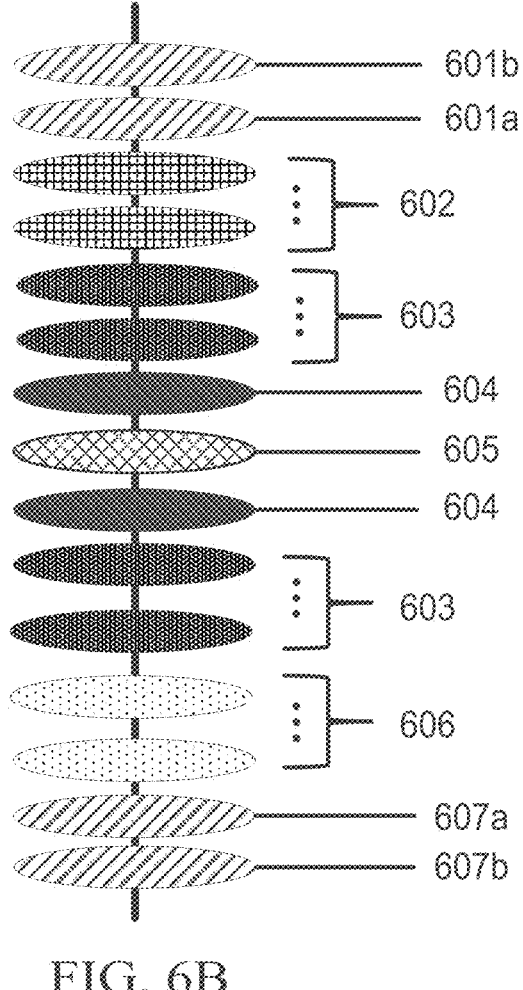
FIG. 6B is a schematic diagram of a memory string in an open block according to an example of the present disclosure.
Figure 6C:
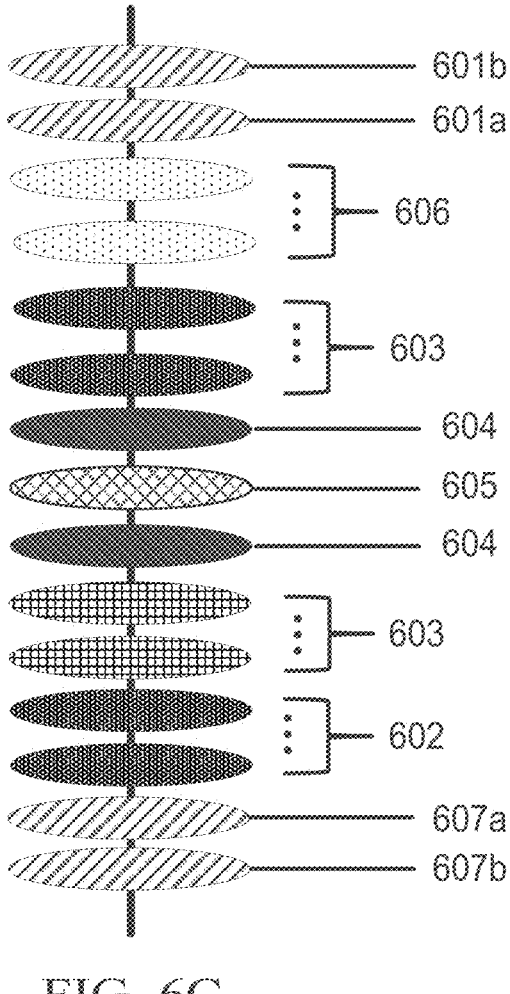
FIG. 6C is a schematic diagram of a memory string in another open block according to an example of the present disclosure.

Referring to FIG. 6A, FIG. 6B, and FIG. 6C, the block can be classified as a close block (refer to FIG. 6A) and an open block (refer to FIG. 6B, FIG. 6C) based on the detection results. When performing a read operation, performing the first read operation on the memory cells coupled to the selected word line in the open block; and performing a second read operation on the memory cells coupled to the selected word line in the close block. It should be noted that the memory string shown in FIG. 6B undergoes the reverse sequence programming, and the unprogrammed memory cells on the memory string (coupled to the third word line 606) are adjacent to the bottom selective transistor BSG (such as 607a). The memory string shown in FIG. 6C undergoes the Normal Program Sequence, and the unprogrammed memory cells on the memory string (coupled to the third word line 606) are adjacent to the top selective transistor TSG (such as 601a). In some other examples, depending on selection of the programming sequence, the unprogrammed memory cells on the memory string can also be located in the middle of the memory string; that is, programmed memory cells (not shown) are located on the upper and lower sides of the unprogrammed memory cells. For the sake of easiness of understanding, one of the memory strings of the open block will be described here and below by taking the memory string shown in FIG. 6B as an example.

Next, details are given to explain the cases where the first read operation is performed on the memory cells coupled to the selected word line of the open block and the second read operation is performed on the memory cells coupled to the selected word line of the close block, with reference to FIGS. 6A, 6B, 7, and 8.

Referring to FIG. 6A and FIG. 7, FIG. 7 is a schematic flowchart of a method for performing a first read operation on memory cells coupled to a selected word line of an open block according to an example of the present disclosure. As shown in FIG. 7, the method for performing the first read operation includes the following operations.

Operation S701: when performing a first read operation on memory cells coupled to a selected word line, applying a first pass voltage to a first word line, applying a second pass voltage to a second word line, and applying a third pass voltage to a third word line, wherein the first word line comprises at least one word line physically located above and below the selected word line respectively, both the second word line and the third word line comprise word lines physically located on a side of the first word line away from the selected word line, memory cells coupled to the second word line comprise programmed memory cells, memory cells coupled to the third word line comprise unprogrammed memory cells, and the first pass voltage, the second pass voltage and the third pass voltage are all different.

It should be noted that the first word line, the second word line and the third word line are all unselected word lines, wherein the first word line is an unselected word line adjacent to the selected word line, which may include one word line, two word lines, three word lines physically located above and below the selected word line respectively. For ease of understanding, descriptions are only given here and below by taking the first word line including one word line physically located above and below the selected word line respectively as an example. With reference to FIG. 6A, the first word line 604 comprises one non-selected word line located adjacent to the selected word line 605 both above and below. The second word line and the third word line are physically located further away from the selected word line compared to the first word line. Here, the memory cells coupled to the second word line comprise programmed memory cells, and the memory cells coupled to the third word line comprise unprogrammed memory cells. It should be noted that the relative positions of the second word line and the third word line on the memory string are different due to the difference in the programming sequence of the memory string (at least one of normal program sequence or reverse sequence programming). For example, reverse sequence programming is taken as an example herein. Referring to FIG. 6B, the second word line 603 is located between the third word line 606 and the first word line 604. That is, the third word line 606 is a word line physically located on the side of the second word line 603 away from the first word line 604. In other words, the distance between the third word line 606 and the selected word line 605 is greater than the distance between the second word line 603 and the selected word line 605. In addition, it should be noted that the following descriptions of the number of first word lines and the relative positional relationship between the second word line and the third word line are only intend to describe the present disclosure and is not used to limit the scope of the present disclosure.

Figure 9A:
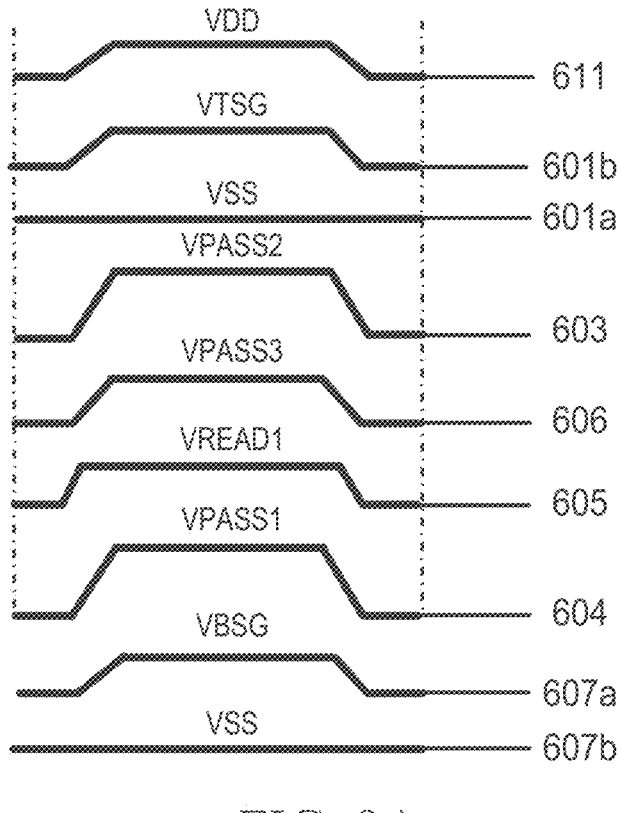
FIG. 9A is a schematic diagram of voltage application when performing a first read operation on an open block according to an example of the present disclosure.

As an example, referring to FIGS. 6B, 7, and 9A, in operation S701, when performing the first read operation, a read voltage Vread is applied to the selected word line 605 (the read voltage here is referred to as a first read voltage Vread1 to differentiate from the read voltage in the second read operation). A first pass voltage Vpass1 is applied to the first word line 604 adjacent to the selected word line 605, a second pass voltage Vpass2 is applied to the second word line 603, and a third pass voltage Vpass3 is applied to the third word line 606. The first pass voltage Vpass1, the second pass voltage Vpass2, and the third pass voltage Vpass3 are all different because the distances between the first word line and the selected word line, between the second word line and the selected word line and between the third word line and the selected word line are different.

In some examples, referring to FIG. 6B, the distances between the first word line and the selected word line, between the second word line and the selected word line and between the third word line and the selected word line gradually increase, and the first pass voltage Vpass1 applied to the first word line 604, the second pass voltage Vpass2 applied to the second word line 603, and the third pass voltage Vpass3 applied to the third word line 606 gradually decrease in sequence. For example, the first pass voltage Vpass1 is greater than the second pass voltage Vpass2, namely, Vpass1>Vpass2, and the second pass voltage Vpass2 is greater than the third pass voltage Vpass3, namely, Vpass2>Vpass3.

In this way, applying the first pass voltage Vpass1 to the first word line 604 adjacent to the selected word line 605 can reduce the voltage difference between the selected word line 605 and the first word line 604, thereby reducing the coupling effect between the selected word line 605 and the first word line 604. In addition, it should be understood that when performing the first read operation, a voltage of 0V is applied to the channel, and a first read voltage Vread1 is applied to the selected word line 605. At this time, an electric field is formed between the memory cells coupled to the unselected word lines (the second word line 603 and the third word line 606) and the channel, which easily causes read interference. Based on this, a second pass voltage Vpass2 is applied to the second word line 603 coupled to the programmed memory cells, and the third pass voltage Vpass3 is applied to the third word line 606 coupled to the unprogrammed memory cells, thereby reducing the read interference (weak programming) caused by the read voltage to the programmed memory cells and unprogrammed memory cells. Thus, the read performance and reliability of the memory device can be improved. In addition, based on the difference in the distances between the unselected word lines (the first word line, the second word line, and the third word line) and the selected word line, different pass voltages can be applied to the unselected word lines. The problem of superposition of read interference and coupling effects during read operations can be addressed in a more accurate manner.

It should be noted that the memory cells coupled to the selected word lines are all programmed memory cells in the example of the present disclosure. In the open block, when the memory cells coupled to the selected word line is the last group (layer) of memory cells in the programmed memory cells, the first word line adjacent to the selected word line overlaps with the third word line coupled to the unprogrammed memory cell. That is, the selected word line is adjacent to the third word line. In this case, when the first read operation is performed, the first pass voltage is applied to the same word line on which the first word line overlaps with the third word line.

Figure 8:
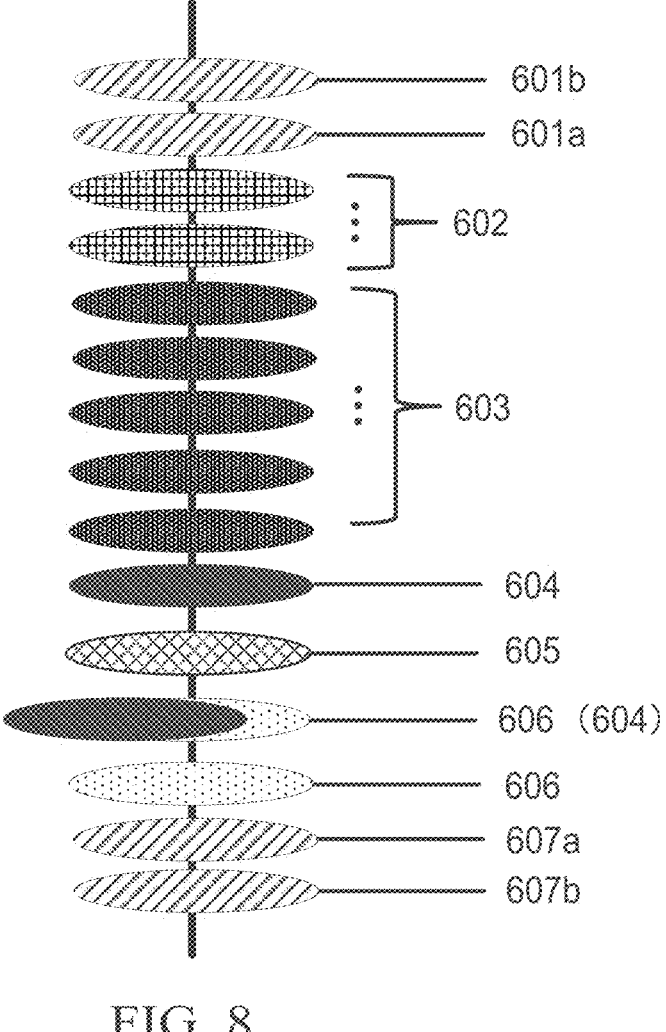
FIG. 8 is a schematic diagram of a memory string in yet another open block according to an example of the present disclosure.

For example, referring to FIG. 8, the selected word line 605 is the word line coupled to the last group (layer) of memory cells in the programmed memory cells, and the first word line 604 adjacent to the selected word line 605 overlaps with the third word line 606, that is, they are the same word line. In this case, when performing the first read operation, the first pass voltage Vpass1 is applied to this overlapping word line. Here, the first pass voltage Vpass1 is greater than the third pass voltage Vpass3, that is, Vpass1>Vpass3. In this way, on the one hand, the coupling effect of the first read voltage on the adjacent word line (such as the first word line) can be reduced, and on the other hand, the read interference to the unprogrammed memory cells (coupled to the third word line) caused by the first read voltage can be also reduced.

In some examples, a dummy cell is also provided in the block, and is coupled to a dummy word line. The physical location of the dummy cell in the block can be selected and set according to the actual situation. In other words, the relative positions of the dummy word line with respect to the first word line, the second word line, and the third word line are different due to the different positions of the dummy cell in the block. That is, a dummy word line can be provided between at least any two of the first word line, the second word line, and the third word line. In the example of the present disclosure, when the first read operation is performed, a second pass voltage is applied to the dummy word line. As an example, referring to FIG. 6B, the dummy cell is coupled to the dummy word line 602. Here, the dummy word line 602 is located between the second word line 603 and the top selective transistor (such as 601a). When the first read operation is performed, the coupling effect between the dummy word line 602 and its adjacent word lines (such as the second word line 603) is reduced by applying the second pass voltage Vpass2 to the dummy word line 602.

Performing the second read operation on a close block will be described below with reference to FIG. 6A and FIG. 9B.

In some examples, the operation method further includes: when performing the second read operation on the memory cells coupled to the selected word line in the close block, applying the first pass voltage to a fourth word line, and applying the second pass voltage to a fifth word line, wherein the fourth word line comprises at least one word line physically located above and below the selected word line respectively, and the fifth word line comprises all word lines physically located on a side of the fourth word line away from the selected word line.

Referring to FIG. 6A, both the fourth word line and the fifth word line are unselected word lines. The fourth word line may include one word line, two word lines, three word lines physically located above and below the selected word line respectively. Descriptions are given by taking the fourth word line including one word line physically located above and below the selected word line respectively as an example. The fifth word line comprises all word lines that are physically located on the side of the fourth word line away from the selected word line. All word lines herein refer to all unselected word lines except the selective lines coupled to the top selective transistor and the bottom selective transistor, and the fourth word line, such as the unselected word lines coupled to programmed memory cells, the dummy word line coupled to the dummy cell (the dummy word line is not marked in FIG. 6A). It should be understood that compared to the fourth word line, the physical position of the fifth word line is further away from the selected word line. For example, referring to FIG. 6A, the fourth word line 609 is located between the selected word line 608 and the fifth word line 610. In addition, it should be noted that the following description about the number of fourth word lines is only intend to describe the present disclosure and is not used to limit the scope of the present disclosure. It should be understood that in a close block, except for the dummy word line, the memory cells coupled to the selected word line, the fourth word line, and the fifth word line are all programmed memory cells.

For example, referring to FIG. 6A, when performing the second read operation, a second read voltage Vread2 is applied to the selected word line 608, a first pass voltage Vpass1 is applied to the fourth word line 609, and a second pass voltage Vpass2 is applied to the fifth word line 610. Here, the first pass voltage Vpass1 is greater than the second pass voltage Vpass2, that is, Vpass1>Vpass2. In the example of the present disclosure, when performing the second read operation, when applying the first pass voltage to the unselected word line (such as the fourth word line) adjacent to the selected word line, coupling effect between the selected word line and adjacent word lines (such as the fourth word line) can be reduced. Applying the second pass voltage to the fifth word line can reduce read interference of the second read voltage to the fifth word line.

It should be noted that the second read voltage Vread2 and the first read voltage Vread1 may be the same or different.

As mentioned above, the block also includes an top selective transistor TSG and a bottom selective transistor BSG, and the number of the top selective transistor TSG and the bottom selective transistor BSG can be set arbitrarily. Referring to FIGS. 6A and 6B, the top selective transistor TSG includes a selected top selective transistor 601b and an unselected top selective transistor 601a, and the bottom selective transistor BSG includes a selected bottom selective transistor 607a and an unselected bottom selective transistor 607b.

Referring to FIGS. 6B and 9A, when the first read operation is performed, a first selective voltage Vtsg is applied to the selected top selective transistor 601b, a second selective voltage Vss is applied to the unselected top selective transistor 601a, a third selective voltage Vbsg is applied to the selected bottom selective transistor 607a, and a fourth selective voltage Vss is applied to the unselected bottom selective transistor 607b. Here, the fourth selective voltage is the same as the second selective voltage.

Figure 9B:
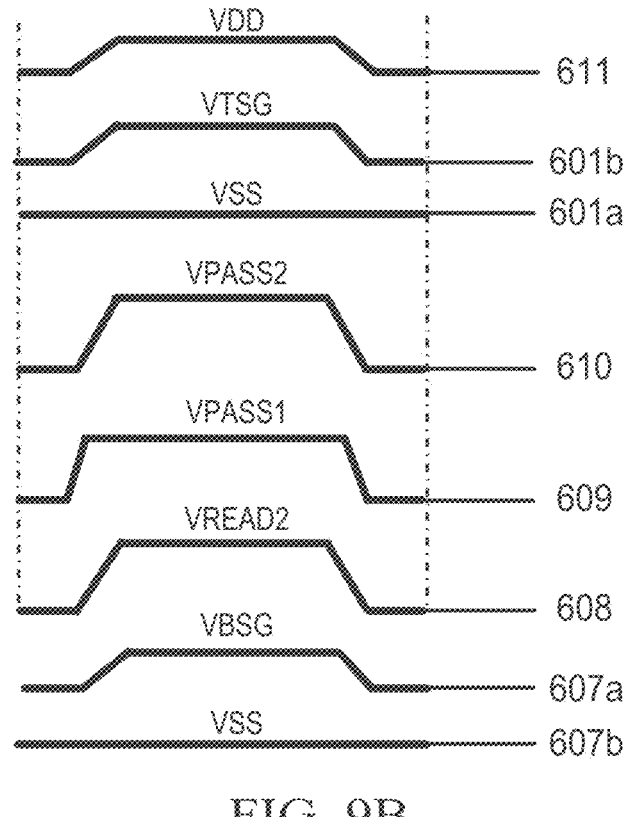
FIG. 9B is a schematic diagram of a voltage application situation when performing a second read operation on a close block according to an example of the present disclosure.

Referring to FIGS. 6A and 9B, when the second read operation is performed, the first selective voltage Vtsg is applied to the selected top selective transistor 601b, the second selective voltage Vss is applied to the unselected top selective transistor 601a, the third selective voltage Vbsg is applied to the selected bottom selective transistor 607a, and the fourth selective voltage Vss is applied to the unselected bottom selective transistor 607b. Here, the fourth selective voltage is the same as the second selective voltage.

In some examples, the memory device further includes a plurality of bit lines. When a read operation is performed, the plurality of bit lines can be divided into selected bit lines and unselected bit lines. For example, referring to FIGS. 9A and 9B, when the first read operation or the second read operation is performed, a bit line voltage Vdd is applied to the selected bit line 611, and a prohibition voltage is applied to the unselected bit lines (not shown in FIGS. 9A and 9B).

In some specific examples, the memory device further includes a counter. The counter is configured to count the number of times of read operations performed on the memory cell, and the counter accumulates the number of times of read operations performed. When the count value of the counter reaches a certain threshold (such as a preset threshold), a read scan of the corresponding block is triggered, that is, reliability detection is performed on the corresponding block. At this time, the operation method further includes: detecting/checking the reliability of the block; and after each detection, resetting the counter value. However, when the number of times of read operations performed frequently reaches the preset threshold, the frequency of reliability detection (e.g., read scan) of the block increases (or the number of times increases). The more times the detection is performed, the greater the impact on the read performance of the memory device.

It should be understood that the wear of the block increases each time a read operation is performed on the memory cell of the block. When the method for performing the first read operation in the above examples of the present disclosure is used to perform a read operation on the open block, the wear of the corresponding block is improved. Based on this, different counting methods are adopted for different blocks in some examples of the present disclosure.

In some examples, the operation method further includes: after the first read operation is performed once, incrementing a read count by a first count value; and after the second read operation is performed once, incrementing the read count by a second count value, the first count value being less than the second count value.

For example, the first count value is 0.7. That is, after performing a first read operation once, the count value of the counter is incremented by 0.7. The first count value can also be set according to the actual situation, such as 0.6, 0.8, and so on. The second count value is 1. That is, after performing a second read operation once, the count value of the counter is incremented by 1. In other examples, if a read operation is performed once for a close block or an open block, the count value of the corresponding counter may be incremented by 1. In this way, in the above examples of the present disclosure, when the first read operation is performed on the open block, and the count value of the corresponding counter is set to less than 1, the frequency of triggering read scan can be reduced, and the number of times read scans is triggered can be reduced, thereby reducing the number of detections of the corresponding blocks and thus improving the read performance and service life of open blocks.

On this basis, in the example of the present disclosure, when performing the first read operation, the coupling effect between the selected word line and its adjacent word lines is reduced by applying a first pass voltage to the unselected word line (such as the first word line) adjacent to the selected word line. At the same time, applying the third pass voltage to the unselected word line (such as the third word line) coupled to the unprogrammed memory cells can reduce the read interference caused by the first read operation to the unprogrammed memory cells. The read performance and reliability of memory devices are improved. In addition, in the example of the present disclosure, the count value of the counter after each execution of the first read operation is set to be less than the count value of the counter after each execution of the second read operation. In this way, the frequency that the count value of the corresponding counter reaches the preset threshold when counting the number of times of the first read operation performed may be decreased to reduce the number of times the read scan is triggered, thereby improving the read performance and service life of open blocks.

Figure 10:
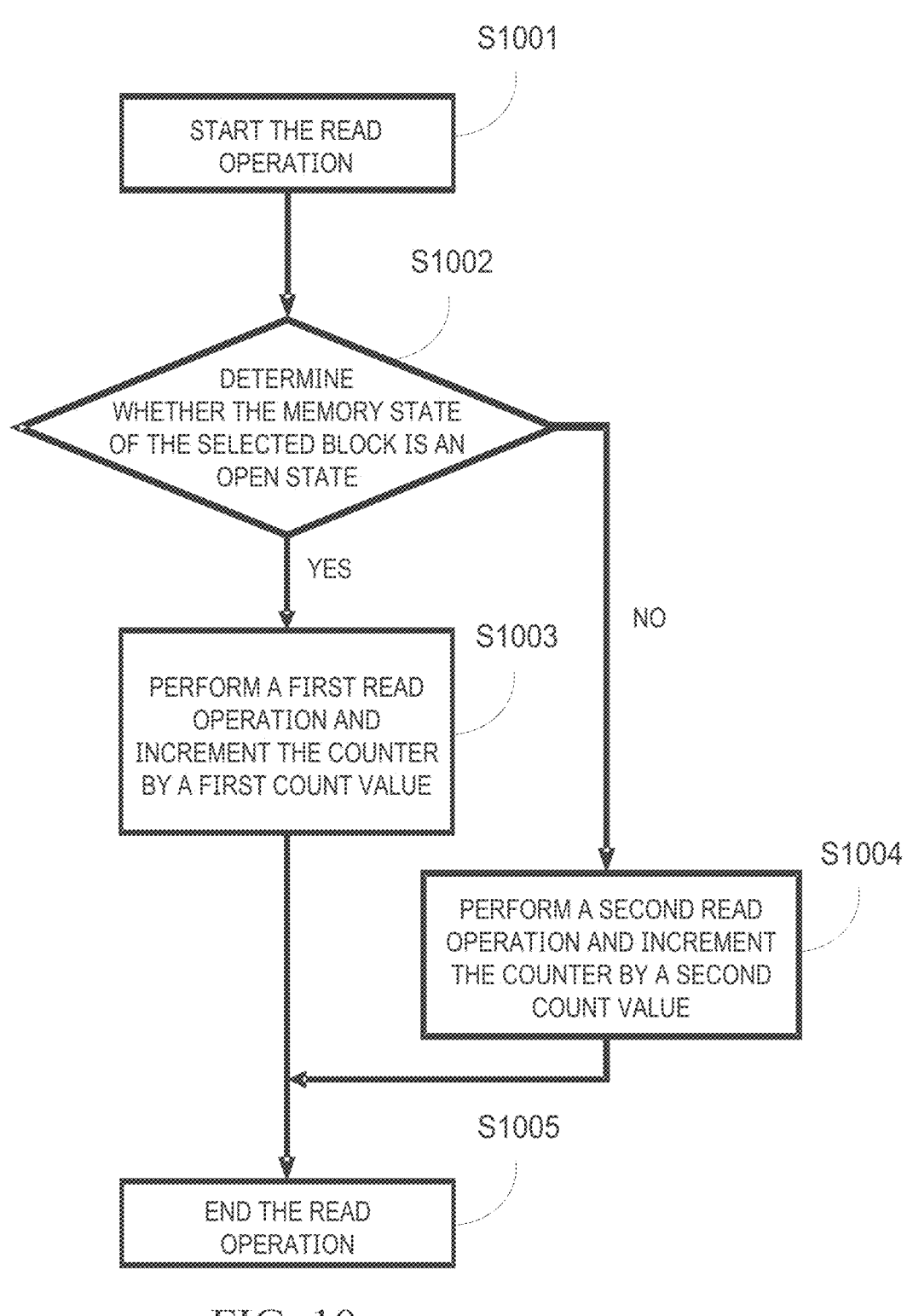
FIG. 10 is a schematic flowchart for implementing a read operation of a memory device according to an example of the present disclosure.

For ease of understanding, the present disclosure will be described in further detail below with reference to FIG. 10. FIG. 10 is a schematic flowchart for implementing a read operation of a memory device according to an example of the present disclosure As shown in FIG. 10, after receiving the read instruction, operation S1001 is executed and the read operation starts.

Operation S1002 is executed. A determination module in the memory device, such as a determinator, makes a determination on the memory state of the currently selected block; and determines whether the memory state of the selected block is an open state based on the detection result.

When the memory state of the selected block is the open state, operation S1003 is executed to perform a first read operation on the selected block, and each time the first read operation is performed, the count value of the counter is incremented by the first count value, such as 0.7.

When the memory state of the selected block is a closed state, operation S1004 is executed to perform a second read operation on the selected block, and each time the second read operation is performed, the count value of the counter is incremented by the second count value, such as 1.

After the first reading operation or the second reading operation is completed, operation S1005 is executed, and the reading operation ends.

Based on the above operation method of the memory device, examples of the present disclosure also provide a memory device, wherein the memory device includes: a memory cell array and a peripheral circuit coupled to the memory cell array, the memory cell array including a plurality of blocks, each of the blocks including a plurality of memory cells and a plurality of word lines coupled to the plurality of memory cells; and the peripheral circuit is configured to: when performing a first read operation on memory cells coupled to a selected word line, apply a first pass voltage to a first word line, apply a second pass voltage to a second word line, and apply a third pass voltage to a third word line, wherein the first word line comprises at least one word line physically located above and below the selected word line respectively, both the second word line and the third word line comprise word lines physically located on a side of the first word line away from the selected word line, memory cells coupled to the second word line comprise programmed memory cells, memory cells coupled to the third word line comprise unprogrammed memory cells, and the first pass voltage, the second pass voltage and the third pass voltage are all different.

In some examples, the first pass voltage is greater than the second pass voltage, and the second pass voltage is greater than the third pass voltage.

In some examples, the peripheral circuit is further configured to: perform memory state detection on a selected block, wherein a result of the memory state detection comprises a close block and an open block; perform the first read operation on the memory cells coupled to the selected word line in the open block; and perform a second read operation on the memory cells coupled to the selected word line in the close block.

In some examples, the peripheral circuit is further configured to: when performing the second read operation on the memory cells coupled to the selected word line in the close block, apply the first pass voltage to a fourth word line, and apply the second pass voltage to a fifth word line, wherein the fourth word line comprises at least one word line physically located above and below the selected word line respectively, and the fifth word line comprises all word lines physically located on a side of the fourth word line away from the selected word line.

In some examples, the peripheral circuit is further configured to: after the first read operation is performed once, increment a read count by a first count value; and after the second read operation is performed once, increment the read count by a second count value, the first count value being less than the second count value.

In some examples, when the first word line and the third word line are the same word line, the first pass voltage is applied to the same word line.

In some examples, a dummy word line is provided between at least any two of the first word line, the second word line, and the third word line; and the peripheral circuit is further configured to: when performing the first read operation, apply the second pass voltage to the dummy word line.

In some examples, the peripheral circuit is further configured to: apply a read voltage to the selected word line during execution of the first read operation, wherein memory cells coupled to the selected word line comprise programmed memory cells.

In some examples, the memory device comprises a three-dimensional NAND type memory.

Based on the above memory device and the operation method thereof, examples of the present disclosure also provide a memory system, comprising: one or more memory devices as described in the above examples of the present disclosure; and a memory controller coupled to the memory devices and configured to control the memory devices.

An example of the present disclosure also provides a storage medium storing thereon executable instructions that, when executed by a peripheral circuit, can implement operations of the method described in the above examples of the present disclosure.

In some specific examples, the storage medium may be memories such as Ferromagnetic Random Access Memory (FRAM), Read Only Memory (ROM), or Programmable Read-Only Memory (PROM), Erasable Programmable Read-Only Memory (EPROM), Electrically Erasable Programmable Read-Only Memory (EEPROM), Flash Memory, magnetic surface memory, optical disc, or Compact Disc Read-Only Memory (CD-ROM); alternatively, it may be various devices including one of the above memory devices or any combination thereof.

In some examples, executable instructions may in the form of a program, software, software module, script, or code, written in any form of programming language, including compiled or interpreted languages, or declarative or procedural languages, and may be deployed in any form, including deployed as a stand-alone program or deployed as a module, component, subroutine, or other means suitable for use in a computing environment.

As an example, executable instructions may, but do not necessarily correspond to, files in a file system and may be stored as part of a file holding other programs or data, for example, stored in one or more scripts in a Hyper Text Markup Language (HTML) document, stored in a single file that is specific to the program in question, or, stored in multiple collaborative files (for example, a file that stores one or more modules, subroutines, or portions of code).

It should be noted that "first", "second", and the like are used to distinguish similar objects and are not used to describe a specific order or sequence. In addition, the technical solutions described in the examples of the present disclosure may be combined arbitrarily as long as there is no conflict.

The above descriptions are only examples of the present disclosure and are not intended to limit the scope of the present disclosure.

What is claimed is:

1. A memory device, comprising:

a memory cell array comprising a plurality of blocks, each of the blocks comprising a plurality of memory cells and a plurality of word lines coupled to the plurality of memory cells; and a peripheral circuit coupled to the memory cell array and configured to:

when performing a first read operation on memory cells coupled to a selected word line, apply a first pass voltage to first word lines, apply a second pass voltage to second word lines, and apply a third pass voltage to a third word line;

perform memory state detection on a selected block, wherein a result of the memory state detection comprises a close block and an open block;

perform the first read operation on the memory cells coupled to the selected word line in the open block;

after the first read operation is performed once, increment a read count by a first count value;

perform a second read operation on the memory cells coupled to the selected word line in the close block; and after the second read operation is performed once, increment the read count by a second count value, the first count value being less than the second count value, wherein the first word lines comprise respective word lines physically located above and below the selected word line, the second word lines comprise word lines physically located on a side of the first word lines away from the selected word line, and the third word line is located on a side of the second word lines away from the first word lines, memory cells coupled to the second word lines comprise programmed memory cells, memory cells coupled to the third word line comprise unprogrammed memory cells, and the first pass voltage, the second pass voltage and the third pass voltage are all different.

2. The memory device according to claim 1, wherein the first pass voltage is greater than the second pass voltage, and the second pass voltage is greater than the third pass voltage.

3. The memory device of claim 2, wherein the peripheral circuit is further configured to:

when performing the second read operation on the memory cells coupled to the selected word line in the close block, apply the first pass voltage to fourth word lines, and apply the second pass voltage to a fifth word line, wherein the fourth word lines comprises respective word lines physically located above and below the selected word line, and the fifth word line comprises all word lines physically located on a side of the fourth word line away from the selected word line.

4. The memory device according to claim 1, wherein when the first word lines and the third word line are the same word line, the first pass voltage is applied to the same word line.

5. The memory device according to claim 1, wherein a dummy word line is provided between at least any two of the first word lines, the second word lines, and the third word line; and the peripheral circuit is further configured to:
when performing the first read operation, apply the second pass voltage to the dummy word line.

6. The memory device of claim 1, wherein the peripheral circuit is further configured to:
apply a read voltage to the selected word line during execution of the first read operation,
wherein memory cells coupled to the selected word line comprise programmed memory cells.

7. The memory device of claim 1, wherein the memory device comprises a three-dimensional NAND type memory.

8. A memory system, comprising:
one or more memory devices, each of the memory devices comprising:
a memory cell array comprising a plurality of blocks, each of the blocks comprising a plurality of memory cells and a plurality of word lines coupled to the plurality of memory cells; and
a peripheral circuit coupled to the memory cell array and configured to:
when performing a first read operation on memory cells coupled to a selected word line, apply a first pass voltage to first word lines, apply a second pass voltage to second word lines, and apply a third pass voltage to a third word line;
perform memory state detection on a selected block, wherein a result of the memory state detection comprises a close block and an open block;
perform the first read operation on the memory cells coupled to the selected word line in the open block;
after the first read operation is performed once, increment a read count by a first count value;
perform a second read operation on the memory cells coupled to the selected word line in the close block; and
after the second read operation is performed once, increment the read count by a second count value, the first count value being less than the second count value,
wherein the first word lines comprises respective word lines physically located above and below the selected word line, both the second word lines comprise word lines physically located on a side of the first word lines away from the selected word line, and the third word line is located on a side of the second word lines away from the first word lines, memory cells coupled to the second word lines comprise programmed memory cells, memory cells coupled to the third word line comprise unprogrammed memory cells, and the first pass voltage, the second pass voltage and the third pass voltage are all different; and
a memory controller coupled to the memory devices and configured to control the memory devices.

9. The memory system of claim 8, wherein the one or more memory devices each comprise a three-dimensional NAND type memory.

10. The memory system of claim 8, wherein when the first word lines and the third word line are the same word line, the first pass voltage is applied to the same word line.

11. The memory system of claim 8, wherein a dummy word line is provided between at least any two of the first word lines, the second word lines, and the third word line; and
the peripheral circuit is further configured to:
when performing the first read operation, apply the second pass voltage to the dummy word line.

12. The memory system of claim 8, wherein the peripheral circuit is further configured to:
apply a read voltage to the selected word line during execution of the first read operation,
wherein memory cells coupled to the selected word line comprise programmed memory cells.

13. The memory system of claim 8, wherein the first pass voltage is greater than the second pass voltage, and the second pass voltage is greater than the third pass voltage.

14. The memory system of claim 13, wherein the peripheral circuit is further configured to:
when performing the second read operation on the memory cells coupled to the selected word line in the close block, apply the first pass voltage to fourth word lines, and apply the second pass voltage to a fifth word line, and
wherein the fourth word lines comprises respective word lines physically located above and below the selected word line, and the fifth word line comprises all word lines physically located on a side of the fourth word line away from the selected word line.

15. An operation method of a memory device, comprising:
when performing a first read operation on memory cells coupled to a selected word line, applying a first pass voltage to first word lines, applying a second pass voltage to a second word lines, and applying a third pass voltage to a third word line;
performing memory state detection on a selected block, wherein a result of the memory state detection comprises a close block and an open block:
performing the first read operation on the memory cells coupled to the selected word line in the open block;
after the first read operation is performed once, incrementing a read count by a first count value;
performing a second read operation on the memory cells coupled to the selected word line in the close block; and
after the second read operation is performed once, incrementing the read count by a second count value, the first count value being less than the second count value,
wherein the first word lines comprises respective word lines physically located above and below the selected word line, the second word lines comprise word lines physically located on a side of the first word lines away from the selected word line, and the third word line is located on a side of the second word lines away from the first word lines, memory cells coupled to the second word lines comprise programmed memory cells, memory cells coupled to the third word line comprise unprogrammed memory cells, and the first pass voltage, the second pass voltage and the third pass voltage are all different, and
the memory device comprises:
a memory cell array comprising a plurality of blocks, each of the blocks comprising a plurality of memory cells and a plurality of word lines coupled to the plurality of memory cells; and
a peripheral circuit coupled to the memory cell array.

16. The operation method according to claim 15, wherein the first pass voltage is greater than the second pass voltage, and the second pass voltage is greater than the third pass voltage.

17. The operation method according to claim 16, further comprising:
when performing the second read operation on the memory cells coupled to the selected word line in the close block, apply the first pass voltage to fourth word lines, and apply the second pass voltage to a fifth word line, wherein the fourth word lines comprises respective word lines physically located above and below the selected word line, and the fifth word line comprises all word lines physically located on a side of the fourth word line away from the selected word line.

18. The operation method according to claim 15, wherein when the first word lines and the third word line are the same word line, the first pass voltage is applied to the same word line.

19. The operation method according to claim 15, wherein a dummy word line is provided between at least any two of the first word lines, the second word lines, and the third word line; and the operation method further comprises:

when performing the first read operation, applying the second pass voltage to the dummy word line.

20. The operation method according to claim 15, further comprising:

applying a read voltage to the selected word line during execution of the first read operation, wherein memory cells coupled to the selected word line comprise programmed memory cells.

* * * * *